United States Patent
Todter

(10) Patent No.: US 11,041,878 B2
(45) Date of Patent: Jun. 22, 2021

(54) THREE DIMENSIONAL SENSING ELEMENT SUSPENSION METHOD AND MEASUREMENT SYSTEM

(71) Applicant: Christopher Todter, San Diego, CA (US)

(72) Inventor: Christopher Todter, San Diego, CA (US)

( * ) Notice: Subject to any disclaimer, the term of this patent is extended or adjusted under 35 U.S.C. 154(b) by 0 days.

(21) Appl. No.: 16/737,203

(22) Filed: Jan. 8, 2020

(65) Prior Publication Data
US 2020/0225261 A1 Jul. 16, 2020

Related U.S. Application Data

(60) Provisional application No. 62/790,640, filed on Jan. 10, 2019.

(51) Int. Cl.
| | | |
|---|---|---|
| *G01P 15/093* | (2006.01) | |
| *H04N 5/225* | (2006.01) | |
| *H02N 15/00* | (2006.01) | |
| *G01R 33/038* | (2006.01) | |
| *G01S 17/50* | (2006.01) | |
| *G01S 17/66* | (2006.01) | |

(52) U.S. Cl.
CPC .......... *G01P 15/093* (2013.01); *G01R 33/038* (2013.01); *G01S 17/50* (2013.01); *G01S 17/66* (2013.01); *H02N 15/00* (2013.01); *H04N 5/225* (2013.01)

(58) Field of Classification Search
CPC ........ G01P 15/093; G01P 15/00; G01P 13/00; G01P 3/44; H04N 5/225; H02N 15/00; H02N 15/02; G01R 33/038; G01R 33/0017; G01S 17/50; G01S 17/66; G10K 15/00; G10K 11/1785; G10K 15/04; G01V 1/005; G01V 1/008; G01V 1/18; G01V 1/186; G01C 19/58; G01C 9/00; G01C 19/5698; G01C 19/24; G01C 9/10; G01C 9/18; B01J 19/10; F16C 32/0438; F16C 39/063; G01H 17/00; G01N 11/16; G01N 2011/147; B01L 2400/0439
See application file for complete search history.

(56) References Cited

U.S. PATENT DOCUMENTS

| | | | | |
|---|---|---|---|---|
| 4,393,708 A | * | 7/1983 | Barmatz | ............ B01J 19/10 181/0.5 |
| 4,549,435 A | * | 10/1985 | Barmatz | ............ G10K 15/00 181/0.5 |
| 4,573,356 A | * | 3/1986 | Barmatz | ............ G10K 15/00 181/0.5 |

(Continued)

*Primary Examiner* — Mohamed K Amara
(74) *Attorney, Agent, or Firm* — Knobbe, Martens, Olson & Bear LLP

(57) ABSTRACT

Methods of determining movement and devices that can be configured to function as an accelerometer, a gyroscope or a magnetometer and is comprised of a sensing element suspended by acoustic waves, and a measurement system capable of determining the position, or rotation of the sensing element without introducing any residual force on the sensing element. The acoustic suspension of the sensing element provides a virtually friction, and torque free method of constraining the sensing element, but not hindering its ability to sense accelerations, rotations or magnetic fields.

20 Claims, 8 Drawing Sheets

(56) References Cited

U.S. PATENT DOCUMENTS

| | | | | |
|---|---|---|---|---|
| 4,736,815 A * | 4/1988 | Barmatz | ............... | G10K 15/00 |
| | | | | 181/0.5 |
| 4,773,266 A * | 9/1988 | Barmatz | ............... | G10K 15/00 |
| | | | | 181/0.5 |
| 4,777,823 A * | 10/1988 | Barmatz | ............... | G10K 15/00 |
| | | | | 181/0.5 |
| 4,800,756 A * | 1/1989 | Barmatz | ............... | G10K 15/00 |
| | | | | 73/570.5 |
| 4,892,863 A * | 1/1990 | Agarwala | ........... | F16C 32/0438 |
| | | | | 310/52 |
| 5,168,183 A * | 12/1992 | Whitehead | ............ | F16C 32/044 |
| | | | | 104/284 |
| 5,203,209 A * | 4/1993 | Watkins | ................. | G01H 17/00 |
| | | | | 73/570.5 |
| 5,500,493 A * | 3/1996 | Guigne | ................... | B01J 19/10 |
| | | | | 181/0.5 |
| 5,844,140 A * | 12/1998 | Seale | ..................... | A61B 8/587 |
| | | | | 73/633 |
| 6,455,982 B1 * | 9/2002 | Hashimoto | .......... | B65G 35/005 |
| | | | | 310/328 |
| 6,832,518 B1 * | 12/2004 | Berstis | ..................... | G01V 7/02 |
| | | | | 310/90.5 |
| 6,898,970 B2 * | 5/2005 | Berstis | ..................... | G01V 7/02 |
| | | | | 310/90.5 |
| 6,918,283 B2 * | 7/2005 | Berstis | ..................... | G01V 7/02 |
| | | | | 33/345 |
| 10,585,026 B2 * | 3/2020 | Gunawan | ............... | G01N 27/00 |
| 2004/0244486 A1 * | 12/2004 | Berstis | ..................... | G01V 7/02 |
| | | | | 73/514.31 |
| 2014/0047903 A1 * | 2/2014 | Sakai | ..................... | G01N 11/14 |
| | | | | 73/54.28 |
| 2016/0150304 A1 * | 5/2016 | Lee | ..................... | H04R 31/006 |
| | | | | 310/90.5 |
| 2017/0028870 A1 * | 2/2017 | Nachtmann | .......... | B60L 15/002 |
| 2017/0063194 A1 * | 3/2017 | Puskarich | ........... | F16C 32/0457 |
| 2018/0241343 A1 * | 8/2018 | Jiang | ..................... | H04N 5/2257 |
| 2019/0162798 A1 * | 5/2019 | Butzloff | ............... | C01B 32/182 |

* cited by examiner

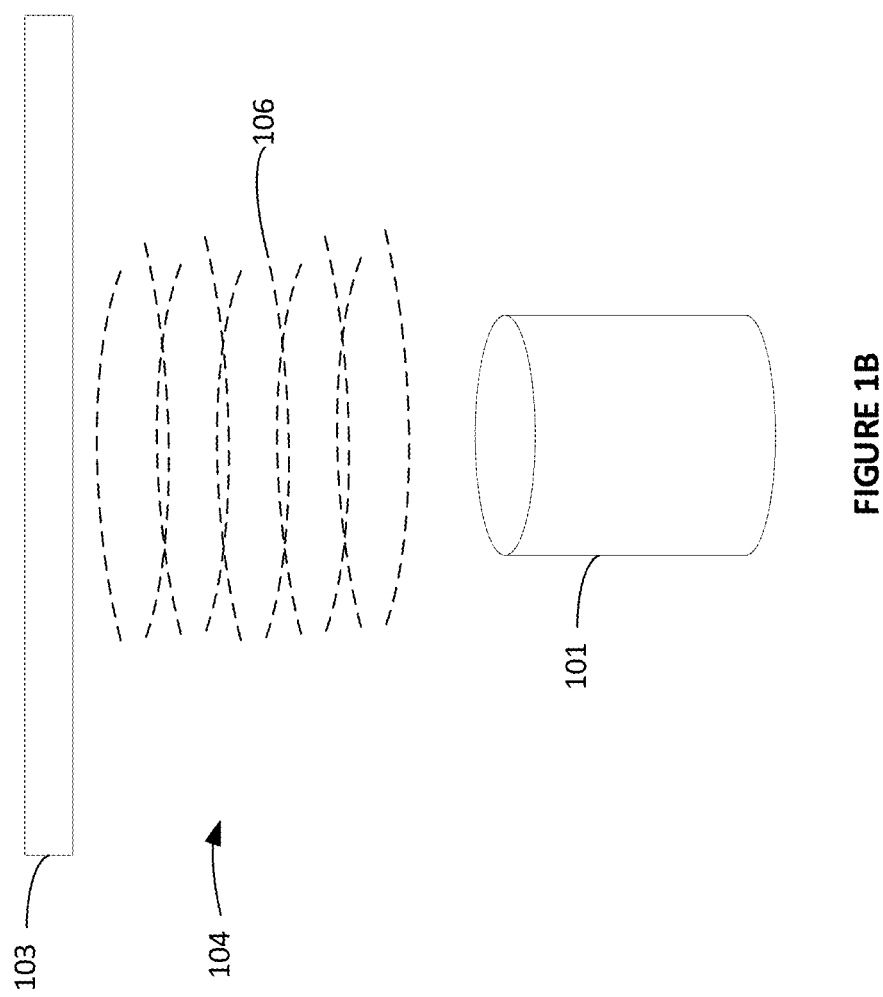

THREE DIMENSIONAL SENSING ELEMENT SUSPENSION METHOD AND MEASUREMENT SYSTEM

INCORPORATION BY REFERENCE TO ANY PRIORITY APPLICATIONS

This application claims the benefit of U.S. Provisional Application No. 62/790,640 filed on Jan. 10, 2019, and titled "THREE DIMENSIONAL SENSING ELEMENT SUSPENSION METHOD AND MEASUREMENT SYSTEM." The entire disclosure of the above-identified provisional application is hereby made part of this specification as if set forth fully herein and incorporated by reference for all purposes, for all that it contains. U.S. Pat. Nos. 4,773,266, 5,203,209, 6,832,518, and U.S. Patent publication Pub. No. US 2004/0244486 A1 are each incorporated in their entirety herein for all purposes for all that they contain.

Any and all applications for which a foreign or domestic priority claim is identified in the Application Data Sheet as filed with the present application are hereby incorporated by reference under 37 CFR 1.57.

BACKGROUND OF THE INVENTION

Field

This disclosure generally relates to features for detecting movement of a device. More specifically, features for an acoustic suspension of an element that can be monitored for movement to determine position or rotation of the element that is caused by the influence of a magnetic field.

Description of the Related Art

Acoustic energy can be used to levitate an object. In one example described U.S. Pat. No. 4,773,266, methods are disclosed for dampening oscillations of an acoustically levitated object or for causing and maintaining such oscillations, and for determining the restoring force constant K on the levitated object by measuring its frequency of oscillation. In another example described in U.S. Pat. No. 5,203, 209, a system is described for determining motion of an object that is acoustically positioned in a standing wave field in a chamber which lies in a microgravity environment. Sonic energy in the chamber is sensed, and variation in the amplitude of the sonic energy is detected, which is caused by linear motion, rotational motion, or drop shape oscillation of the object. In another example, described in U.S. Pat. No. 6,832,518, a pressure wave sensor levitates a mass with respect to a base which may be comprised of a diamagnetic material, with the levitated mass also having a permanent magnetic property. A second permanent magnet is optionally configured such that it attracts the levitation mass away from the base to overcome gravitational force on the mass, thereby suspending the mass over the surface of the base. The mass is contained in a nonmagnetic, non-shielding and optionally optically-transparent housing so as to limit its excursion within a range of levitation positions. A position measurement means such as a laser interferometer, capacitance detector, or pickup coil is configured to measure positional deviations of the mass in response to incident pressure wave, the output of which being an electronic signal representing the pressure wave. In another example, described in Pub. No. US 2004/0244486 A1, an inertial navigation device for an ion propulsion driven spacecraft, an accelerometer is formed by levitating magnet in a box or sphere compose of die magnetic material and a means for measuring the position of the magnet within the closure is provided so that over time the position of the magnet can be monitored, and knowing the mass of the suspended magnet displacement over time of the magnet can be used to calculate acceleration which can then be used to determine position of a space vehicle. However, none of these disclosures address implementing a technique which allowed the acoustic suspension of an object in a device to determine information about the multi-axial motion of the device that suspends the object relative to an external magnetic field, rather than the movement/oscillation of the object itself (e.g., that is affected by adjusting the size of the chamber), and such a technique would have many uses.

SUMMARY

The devices, systems, and methods of the present disclosure have several features, no single one of which is solely responsible for its desirable attributes. Without limiting the scope of this invention as expressed by the claims which follow, certain innovations will now be discussed briefly. After considering this discussion, and other section provided herein, one will understand how the features of this disclosure provide several advantages.

One innovation includes a system for determining movement, the apparatus including a sensor comprising an element having a magnetic property along an axis; a plurality of ultrasound transmitters arranged around the element, the plurality of ultrasound transmitters configured to collectively generate ultrasonic sound waves that strike the element, causing the element to be suspended in a space between the plurality of ultrasound transmitters with the axis aligned in a position relative to a magnetic field; a detection mechanism configured to detect the movement of the element and produce corresponding movement signals; and a controller configured to receive the movement signals and determine movement information of the sensor in at least one dimension.

Various embodiments of the system may include other features. In some embodiments, the element is spherical. In some embodiments, the detection mechanism comprises at least one camera. In some embodiments, the element comprises one or more alignment marks, and the at least one camera is configured to image the one or more alignment marks. In some embodiments, the detection mechanism comprises at least one laser tracking system comprising at least one laser light transmitter and one laser light receiver. In some embodiments the plurality of ultrasound transmitters comprises two or more ultrasound transmitters. In some embodiments, the plurality of ultrasound transmitters comprises three or more ultrasound transmitters. In some embodiments, the plurality of ultrasound transmitters comprises four or more ultrasound transmitters. In some embodiments, the plurality of ultrasound transmitters are arranged to produce ultrasound waves aligned in at least three different directions. In some embodiments, the element is magnetically polarized. In some embodiments, the apparatus further includes a fluid surrounding the element. In some embodiments, the fluid is a gas. In some embodiments, the fluid is a liquid. In some embodiments, the apparatus further includes one or more excitation coils configured to cancel the effect of an existing magnetic field on the element.

BRIEF DESCRIPTION OF THE DRAWINGS

The features and advantages of the devices and methods described herein will become more fully apparent from the following description and appended claims, taken in conjunction with the accompanying drawings. These drawings depict only several embodiments in accordance with the disclosure and are not to be considered limiting of its scope. In the drawings, similar reference numbers or symbols typically identify similar components, unless context dictates otherwise. In some instances, the drawings may not be drawn to scale.

FIG. 1B illustrates an example of an embodiment where one or more ultrasonic transmitting devices are placed into a resonant cavity, such that the cavity presents itself as resonant at the transmitter's frequency, and thus there will be a pattern of standing wave(s) present in the cavity.

DETAILED DESCRIPTION OF CERTAIN INVENTIVE ASPECTS

Figure 1A:
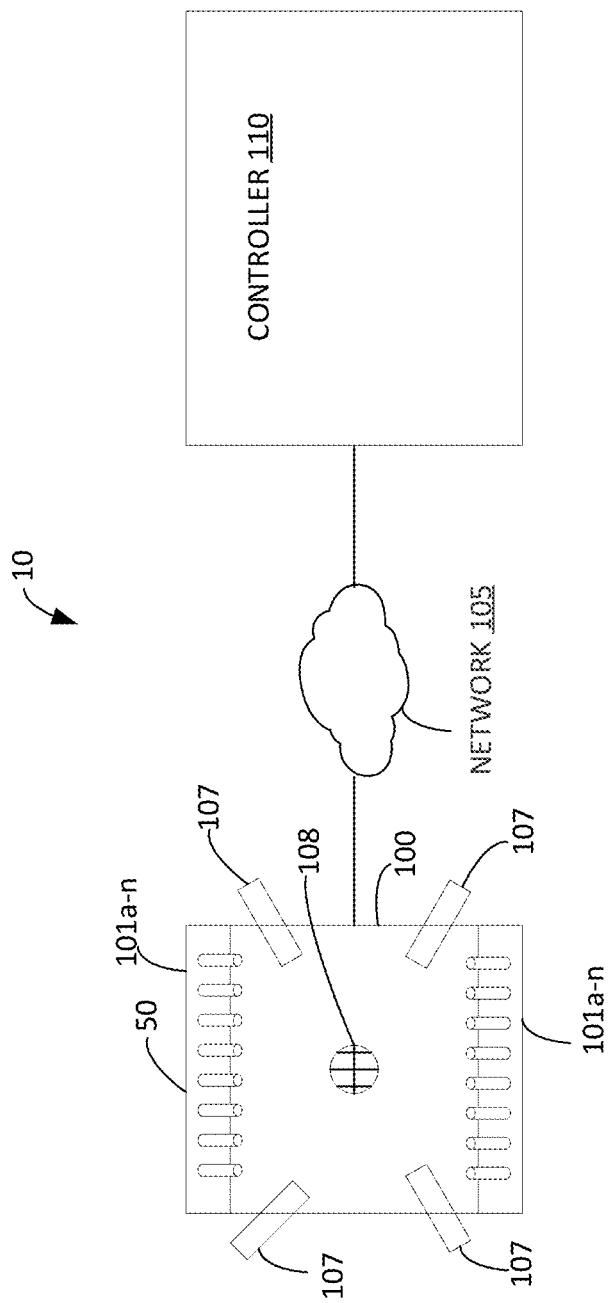
FIG. 1A is a block diagram illustrating an example of a three dimensional (3D) sensing element suspension measurement system.

The following detailed description is directed to certain specific embodiments of the invention. However, the invention can be embodied in a multitude of different ways. It should be apparent that the aspects herein may be embodied in a wide variety of forms and that any specific structure, function, or both being disclosed herein is merely representative of one or more embodiments of the invention. An aspect disclosed herein may be implemented independently of any other aspects and that two or more of these aspects may be combined in various ways. For example, a device may be implemented, or a method may be practiced, using any number of the aspects set forth herein. In addition, such an apparatus may be implemented or such a method may be practiced using other structure, functionality, or structure and functionality in addition to, or other than one or more of the aspects set forth herein.

Measurement of inertial motions or magnetic fields is necessary in navigation or detection of magnetic fields or field anomalies. Devices to accomplish these measurements represent a large field of technology and innovation. In almost every implementation, there is a need to minimize residual friction or torque on the sensing element to eliminate bias or random error generation, and to improve the sensitivity and thus the signal to noise ratio.

Prior art in magnetometers goes back to the Chinese before 1000 AD, where a "needle" was magnetized by rubbing it on a naturally magnetic mineral lodestone, which was suspended on a silk thread, and would align itself with the earth's local magnetic field. Magnetic compasses to this day employ these same principles, although generally use jeweled bearings instead of a thread suspension. The limitations of this approach are that there is some friction or torque applied by the restraining bearing mechanism and that the needle is primarily constrained to operate in only the horizontal plane, whereas the magnetic field is a three dimensional (3D) field.

Electronic sensing of the magnetic field has progressed from early fluxgate magnetometers using energized coils to current technology of using solid state magneto-resistive elements or Hall effect devices. These devices have extended the sensitivity and can include the full three dimensional magnetic field sensing, but they are ultimately limited in sensitivity by their inherent electronic noise floors. The current state of the art in technical magnetometry consists of quantum devices which rely on the spin of electrons to sense the magnetic field, and laser interrogation to determine the electron spin directions. These exquisite devices have the highest sensitivity available, but are relatively expensive and require more power than desirable.

Both accelerometers and rotation measurement gyroscopes may be implemented in a wide variety of measurement systems, most designed to remove friction or restraining force or torque. They include the use of jeweled bearings, liquid bearings, magnetic suspension, tuning forks, force balance techniques, micro machined proof mass suspension systems, fiber optic, laser interferometry and quantum measurement of electron spin.

Various embodiments of the devices illustrated in FIGS. 1-7 include a sensing element suspended in a fluid (e.g., a liquid or a gas) and contained within a volume (or housing) so that it is free (or substantially free) from friction or torque, and a mechanism to measure the three dimensional position and rotation of the sensing element. "Housing" as used herein is a broad term that refers to mechanical structure that either partly surrounds or completely surrounds a certain volume (e.g., a three dimensional portion of a space). For example, the housing may include two (or more) portions positioned near each other (e.g., a lower portion and an upper portion). In another example, the housing can include two or more portions that together enclose a volume of a space. In some implementations, at least a portion of the housing can be watertight and can surround liquid or a gas, and can contain a liquid or gas. In some implementations, the entire housing is watertight and can contain a liquid or gas.

In the case using this method for a magnetometer, in some embodiments the suspended sensing element may contain a magnet (e.g., a bar magnet), so that the magnet and the suspended element align with the imposed magnetic field. In some embodiments, the element itself is magnetized.

In the case of the device being configured as an accelerometer, the sensing element is essentially simply a proof mass, that is subject to inertial forces, namely movement of the instrument case would imply a movement of the proof mass within the enclosed volume as the proof mass is initially at rest and the case is moved. The relative movement of the proof mass and the housing can be sensed, and countered with necessary restoring force, which becomes a measurement of the applied acceleration.

An approach similar to the accelerometer is used to measure rotations. The proof mass will show a rotation relative to the housing when the housing is rotated, and this rotation becomes indicative of the applied rotation, both as a rate and as a rotational displacement.

The frictionless and torqueless suspension and containment of the sensing element is vital to the operation of the device The measurement of the three dimensional rotation of this suspended object in a non-contact, non-invasive manner is the second aspect of this invention.

Both the suspension and the measurement are described in what may be considered potential embodiments below.

First the mechanism of suspension and containment of the sensing element are described in multiple potential arrangements.

The fundamental concept for suspension of the sensing element is the use of ultrasonic waves. There are at least three possible configurations known for suspending an object in an ultrasonic wave field.

The following is a list of certain components that are described and enumerated in this disclosure in reference to the above-listed figures. However, any aspect of the devices illustrated in the figures, whether or not named out separately herein, can form a portion of various embodiments of the invention and may provide basis for claim limitation relating to such aspects, with or without additional description. The enumerated components include:
- 10 three dimensional (3D) sensing element suspension measurement system
- 50 sensor
- 100 housing
- 100A upper portion of housing (or first portion of housing)
- 100B lower portion of housing (or second portion of housing)
- 101 ultrasonic transmitters
- 101A ultrasonic transmitters positioned on first portion of housing
- 101B ultrasonic transmitters positioned on second portion of housing
- 103 reflector
- 104 resonant cavity
- 105 network
- 106 ultrasonic standing waves
- 107 element movement detection mechanism
- 108 element
- 110 controller
- 112 magnetic material
- 114 aperture
- 116 vertical coils (or coils aligned in a first direction)
- 118 horizontal coils (or coils aligned in a second direction perpendicular to the first direction)
- 120 first marking on element
- 122 second marking on element
- 123 third marking on element
- 124 fourth marking on element FIG. 1A is a block diagram illustrating an example of a three dimensional (3D) sensing element suspension measurement system 10, according to some embodiments. The system 10 includes a sensor 50 which communicates with a controller 110 via a network 105. The network 105 can be a wired or a wireless network. Using the network 105 the controller 110 can provide control information to control components of the sensor 50, for example, to control ultrasonic transmitters 101 of the sensor 50. The controller 110 can receive information from components of the sensor 50, for example, one or more element movement detection mechanisms 107. In some embodiments, the controller 110 is coupled to the sensor 50 and provides power to the sensor 50 (e.g., components of the sensor 50).

Figure 2:
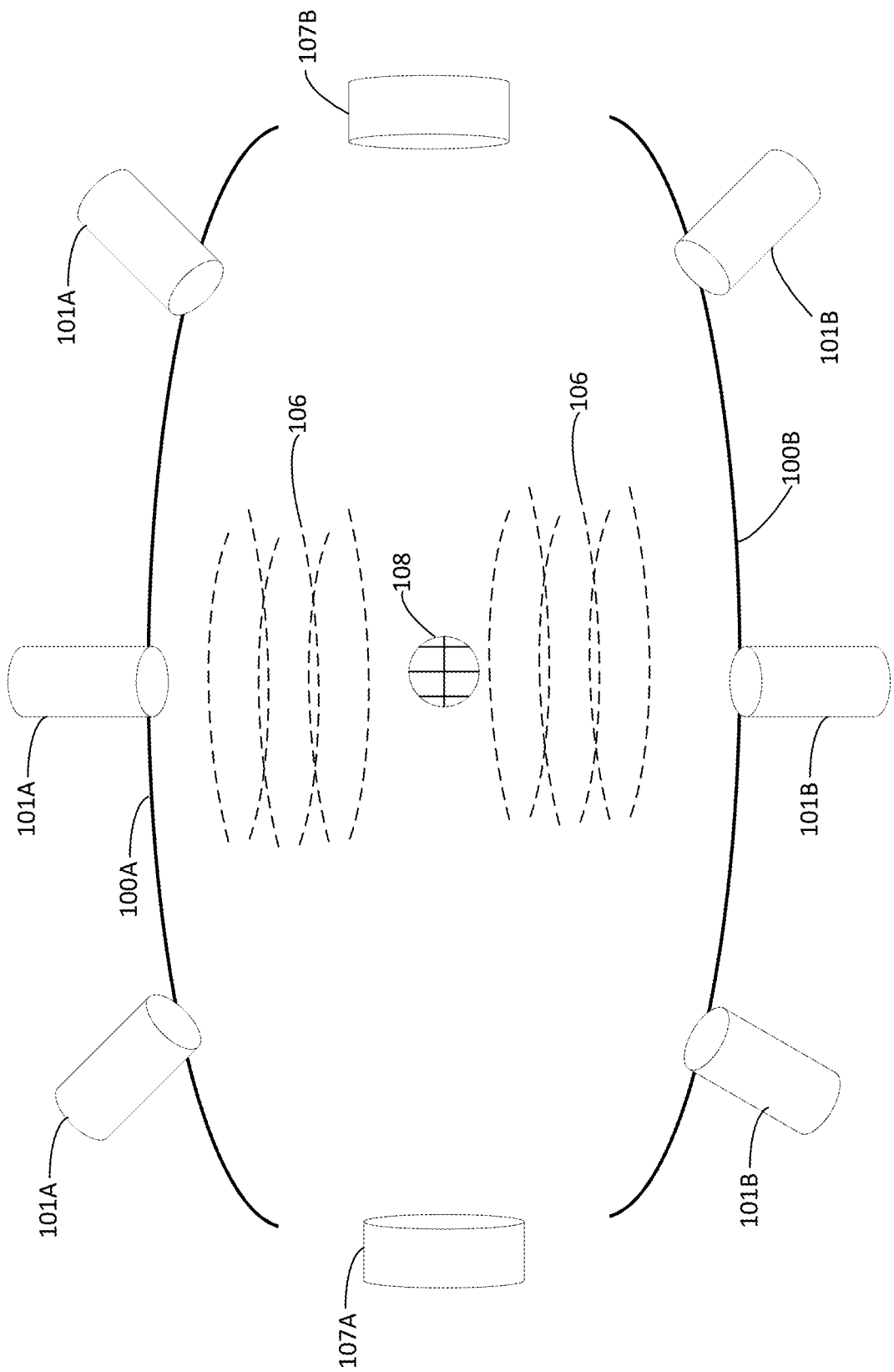
FIG. 2 illustrates an example of another embodiment of supporting an object in an ultrasonic field is to form the standing waves in a volume using an array of transmitters rather than having the volume by resonant.
Figure 6:
FIG. 6 is a picture illustrating an example of an embodiment of a 3D sensing element suspension measurement system where the housing includes an upper portion having a plurality of ultrasonic transmitters and a lower portion having a plurality of ultrasonic transmitters.
Figure 7:
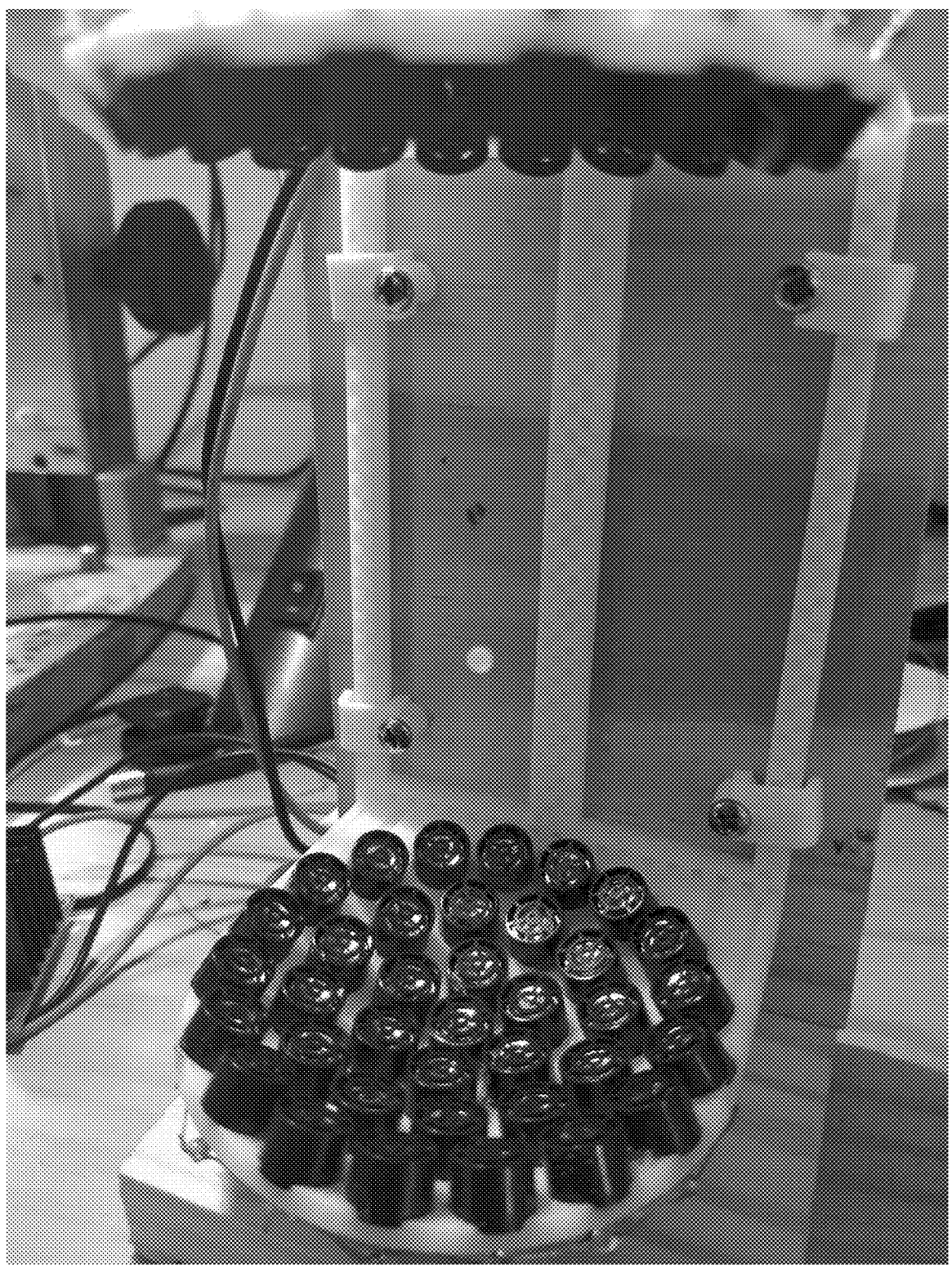
FIG. 7 is another picture of the embodiment of a 3D sensing element suspension measurement system illustrated in FIG. 6.

The sensor 50 includes a housing 100 and components which are positioned on or in the housing 100. The components can be either partially within, or completely within, the housing 100. The components of the sensor 50 function to suspend the element 108 and a space within the housing 100 and measure the movement of the element 10. The housing 100 may be a complete enclosure of a space in some embodiments, in other embodiments the housing 100 may include or more portions of a wall that do not form a contiguous enclosure. In some examples, the housing includes an upper wall on which ultrasonic transmitters are positioned, and a lower wall on which ultrasonic transmitters are positioned. One or more walls of the housing 100 may be curved, for example, as illustrated in FIGS. 2, 6, and 7. In some embodiments, one or more of the walls of the housing 100 may be planer.

The components can include a plurality of ultrasonic transmitters 101a-n that are disposed in various portions of the housing 100. As illustrated in FIG. 1A, a first set of ultrasonic transmitters 101a-n is positioned on an upper portion of the housing 100 and a second set of ultrasonic transmitters 101a-n is positioned on a lower portion of the housing 100. Although it is contemplated that in some embodiments the sensor 50 includes a single ultrasonic transmitter 101 (for example, as illustrated in FIG. 1B) preferred embodiments include a plurality of ultrasonic transmitters 101, where at least a portion of the ultrasonic transmitters are positioned on one side of a space in which an element 108 can reside, and at least a portion of the ultrasonic transmitters are positioned on a second side of the space in which the element 101 can reside, the second side being opposite of the first side such that when element 108 is in the space there are at least a portion of ultrasonic transmitters on at least two different sides of the element 108. The number of ultrasonic transmitters can vary with a particular implementation. For example, some embodiments may include 2 to about 10 ultrasonic transmitters. Some other embodiments may include about 6 to about 26 ultrasonic transmitters. Other embodiments may include more than 26 ultrasonic transmitters. For example, the illustrated embodiment shown in FIGS. 6 and 7 includes 37 ultrasonic transmitters positioned on a lower portion of a housing and 36 ultrasonic transmitters positioned on the upper portion of a housing.

The components of the sensor 50 also include one or more element movement detection mechanisms 107. An element movement detection mechanism senses movement of the element 108 and communicates sensed information of the movement of element 108 to the controller 110 via the network 105. An element movement detection mechanism may be, for example, in imaging system that captures images of the element 108 and provides the images to the controller 110 which can determine the movement of the sensor 108 using image processing software to track markings on the element 108. In other embodiments, other types of element movement detection mechanisms may be used. In some embodiments, the element movement detection mechanism may include one or more magnetometers.

FIG. 1B illustrates an example of one embodiment that uses one or more ultrasonic transmitting devices 101A positioned to transmit ultrasonic waves into a resonant cavity 104. This embodiment includes a reflector 103 that receives ultrasonic waves and reflects them back into the resonant cavity 105. A resonant cavity 104 may exist, for example, in the space within the housing 100 illustrated in FIG. 1A. in such embodiments, the cavity presents itself as resonant at the transmitter's frequency, and thus when the ultrasonic transmitters 101 are activated there will be a pattern of standing wave(s) 106 present in the cavity 104. If the transmitters are arranged correctly, the standing waves can form three dimensional (3D) nodes, such that there is a standing wave that will support a weight of an element 108 and contain it from translating in any direction. That is, the one or more ultrasonic transmitters 101 are configured and arranged in the resonant cavity 104 such that the acoustic energy (e.g., ultrasonic waves) supports the element 108. In some examples, the element is in a fluid (e.g., a gas or a liquid) which may help to suspend the element with the acoustic energy. An analogy in two dimensions is that of surfing a wave, where the surfer is propelled forward by the wave face. In the case of a standing wave, the wave represents an available force to suspend or contain an object.

A more detailed description of this possible embodiment follows. A three dimensional (3D) array of ultrasonic transducers (e.g., 40 kHz, 12 mm diameter devices) is formed by placing the transmitters in a housing (e.g., a 3D printed housing). In this example, the has two opposing segments upper and lower, each containing 37 transmitters, positioned to transmit into the housing. The transmitters on the bottom are arranged so that they are positioned on a spherical surface, facing upward. The upper segment is the mirror image. The two segments oppose each other at a distance of approximately 100 mm.

If the transmitters had been arranged on two opposing planar surfaces, they would have formed planar sheets of acoustic nodes, each of which would support a weight, but in only the vertical direction, there would be no restraint to prevent the weight from sliding sideways off the planar node. Having the transmitters in a spherical arrangement, means that the planar node sheets are turned into bowl-like shaped nodes, that have a restraining force in both the X and Y directions as well as the vertical Z direction.

This transmitter arrangement produces a series of these bowl-like nodes between the opposing array segments. The spacing is determined by the wavelength of the ultrasound, which in this case (speed of sound is 343 m/s in air, frequency of transmitters is 40 kHz) 8.75 mm. This means that the supported volume must be less than the wavelength, actually limited to half the wavelength.

In an illustrative example, a polypropylene sphere of 4 mm diameter, weighing less than 0.1 grams is supported in one of several of the bowl-like nodes, suspended by the ultrasonic standing wave. In other examples, the sphere can be formed from other materials and have different diameters (e.g., 0.5 mm-10 mm), although generally smaller diameter spheres are preferred because the strength and/or number of ultrasonic transmitters must be scaled accordingly to sufficiently suspend the sphere by ultrasonic waves.

To realize the magnetometer function, in this illustrative embodiment an aperture is drilled through the sphere at an axis with a 0.25 mm hole, into which is inserted a rare earth bar magnet which is 0.25 mm diameter and 4 mm long. When this magnet enabled sphere is now suspended in an acoustic node, the magnet in the sphere aligns itself with the external environmental magnetic field, with no frictional restraint.

The remaining function necessary to make this device into a magnetometer is to be able to measure the rotation of the sphere in all three axes, relative to the housing, and without introducing any extraneous forces or torques on the sphere. In this embodiment, it is accomplished in a very straight forward manner by use of three cameras, one on each axis, trained on the sphere. The sphere has a pattern of markings, patterned in size, shape, position, and color, that allows the three cameras to determine a rotation angle in all there axes accurately and unambiguously.

The size and shape of these nodes is dependent on the frequency (and thus the wavelength) of the transmitter, and the available force is dependent on the power output of the transmitter. This methodology typically can support a few grams of mass in sizes approaching half the wavelength of the ultrasonic transmission. For a transmitter operating at 40 kHz in air, the wavelength is about 8.5 mm and objects of at least 3-4 mm can be supported. This methodology however has the limitations of the frequency stability of the transmitter(s) and the critical sizing of the resonant cavity.

FIG. 2 illustrates an example of another embodiment of supporting an element 108 within a space that has standing waves 106 in a volume using an array of two or more ultrasound transmitters 101 rather than having the volume be resonant. In this example, six ultrasound transmitters are arranged on a housing 100, each of the ultrasound transmitters 101 transmitting into the housing 101 and into the volume inside the housing 101 to suspend element 108 in the space. The housing in this example includes an upper portion of housing 100A and a lower portion of housing 100B. This gives some more freedom to the shaping of the standing waves and nodes within the volume, and less sensitivity to transmitter stability. It does have the same physical limitations of the object size relative to the wavelength of the transmission. In some examples of this embodiment, the element is in a fluid (e.g., a gas or a liquid) which may help to suspend the element with the acoustic energy. For example, the volume of the housing contains a fluid surrounding the element 108. FIG. 2 also illustrates two element movement detection mechanisms 107A, 107B positioned on opposite sides of the element 108. Although not shown here, a controller 110 may be connected to the ultrasound transmitters 101 to control the ultrasound transmitters 101 to produce acoustic energy in conjunction with each other to produce the standing waves to keep an element suspended in the volume.

Figure 3:
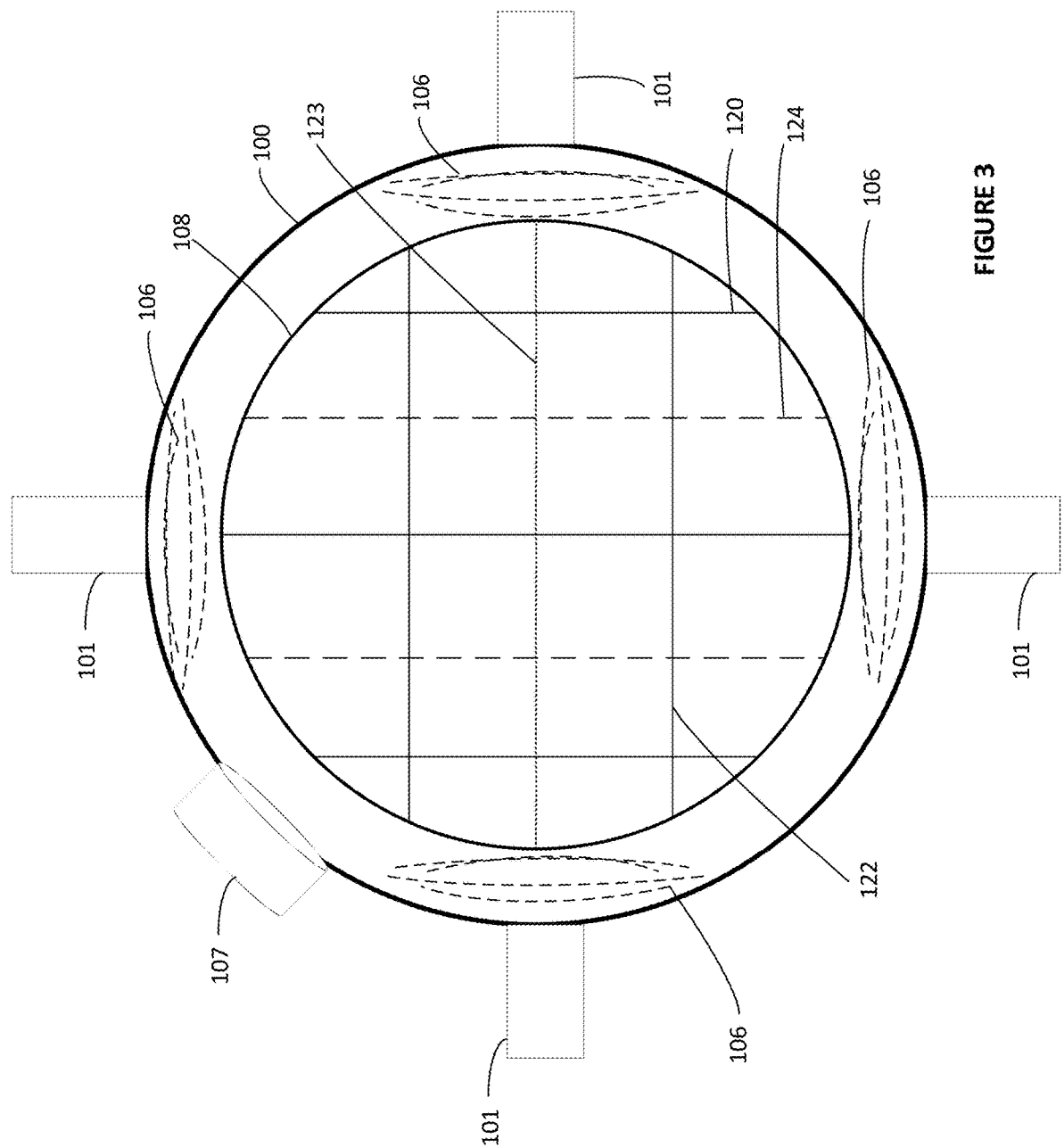
FIG. 3 illustrates an example of another embodiment of an apparatus and a method for ultrasonic suspension of an element.

FIG. 3 illustrates an example of another embodiment of an apparatus and a method for ultrasonic suspension of an element 108. This method of ultrasonic suspension also involves standing waves 106, however the standing wave 106 is directly formed between the surface of the element (object) 108 and the transmitter(s) 101 surrounding the element 108. The standing wave comes into being because of the interaction of the transmitter's wave and the reflection of that wave from the object's surface, and then subsequent reflection from the surround of the transmitter. As shown in FIG. 3, this methodology is limited to small gaps between the transmitter 101 and the object 108 (e.g., half of the wavelength of the transmission frequency), but will support much larger areas. The supportable weight is still limited by the transmitter power output.

By appropriate sizing, location of transmitters, power levels, and mass of the object, a full three dimensional containment of the object is possible.

FIG. 3 also illustrates markings on the element 108 that can be used to determine the movement of the element 108. In this example, the markings include a first marking 120, a second marking 122, a third marking 123, and a fourth marking 124. Relative to the orientation of FIG. 3, the first marking 120 is a solid line aligned in a vertical direction on the element 108. The second marking 122 is a solid line aligned in a horizontal direction on the element 108. The third marking 123 is a dashed line aligned in a horizontal direction on the element 108 and is aligned along a diameter of the element 108. The fourth marking 124 is a dashed line aligned in a vertical direction on the element 108, where the type of "dashing" on the fourth marking is different from the type of dashing on the third marking 123. As shown in FIG. 3, the element 108 may include additional markings as well. The vertical markings in the horizontal markings can be perpendicular to one another, or can be aligned at any orientation that is known. With the element 108 marked as indicated (or with similar other distinct markings), the element movement detection mechanism 107 can capture images of the element 108 as it moves communicate the images to a controller 110 (FIG. 1A), and the controller 110 can track the movement of the element 108.

It is noted that all three of these approaches, the object that is levitated (or suspended) by the acoustical waves comprises spherical-shaped element (body). In some implementations, a spherical-shaped object is preferred as this may contribute to the success of this device. The object can be any size that results in the object being able to be suspended by a plurality of ultrasonic transmitters. For example, in some embodiments the object can be 3-4 mm in diameter. In other embodiments, the object is less than about 1 mm in diameter, about 1-2 mm in diameter, 2-3 mm in diameter, about 3-4 millimeters in diameter, about 4-5 millimeters in diameter, about 5-6 millimeters in diameter, about 6-7 mm in diameter, about 7-8 mm in diameter, about 8-9 mm in diameter, about 9-10 mm in diameter, or greater than about 10 mm in diameter. As used herein, "about" refers to a tolerance of up to 10% of the dimension the word "about" modifies. For example, a diameter of about 4-5 mm refers to a diameter of 3.6 mm to 5.5 mm. In some embodiments, the object includes magnetic material. In some implementations, the object can be a spherically-shaped and configured to hold magnetic material. For example, a hole can be drilled in a spherical-shaped object, the hole aligned with a diameter of the object, and a magnet can be positioned in the hole.

In some embodiments, the body can generally be symmetrical in terms of weight distribution or density. These two features ensure that there is no torque applied to the body by the ultrasonic suspension. If the body was not symmetrical in terms of weight distribution, for example, then it would still be suspended, but it would rotate so that the heavier side was at the bottom, as in pendulous effect. This spherical shape and uniform symmetrical weight distribution applies to the body including the magnetic sensing element (cylindrical magnet).

The medium of operation of this suspension needs to be described including possible variation of implementation. The simplest form of the device is to have the suspension and containment of the body and magnet in air. This allows for use of readily available ultrasonic devices in terms of frequency and sealing, and has no added difficulties of pressure compensation of the vessel itself. In other embodiments, other types of gas maybe used.

There are, however, some benefits of operation of the suspended element in a liquid fluid. The principle benefit is that the body can be made to be neutrally buoyant in the fluid, thus removing the need to support the body against gravity. This immediately opens up the use of the device in space or in different gravity environments. In addition, it substantially lowers the transmitter power requirements, since transient accelerations are then the only forces to overcome. The use of fluid has an additional impact, namely it provides significant damping of the rotation of the body. This means that the body is more stable in its position, but that its frequency response is lowered. This effect can be tailored to some degree by control of the viscosity of the fluid.

Now, having the frictionless, torqueless, suspended body able to rotate freely and align with the applied local magnetic field or to simply sit motionless in the volume (in the embodiment as an accelerometer or a gyroscope), there remains the need to be able to measure its position and rotation in 3 dimensions accurately, with maximum resolution and minimum noise.

Two possible approaches are described below, the first method only applicable to the magnetometer.

In an embodiment as a magnetometer, the first is to use the fact that the tiny sensing magnet has provided a substantial concentration of the local magnetic field, and is aligned with the local field, so represents a powerful indicator of the field. This means that relatively simple fluxgate, magneto-resistive, or Hall effect devices could be used to sense the rotation of the embedded magnetic needle. The normal limitations of these measurement approaches with respect to their noise floor would be relaxed due to the fact that the measurement would be of the magnetic field of the needle, which is a concentrated representation of the local applied field, rather than trying to measure the local field directly.

Figure 4:
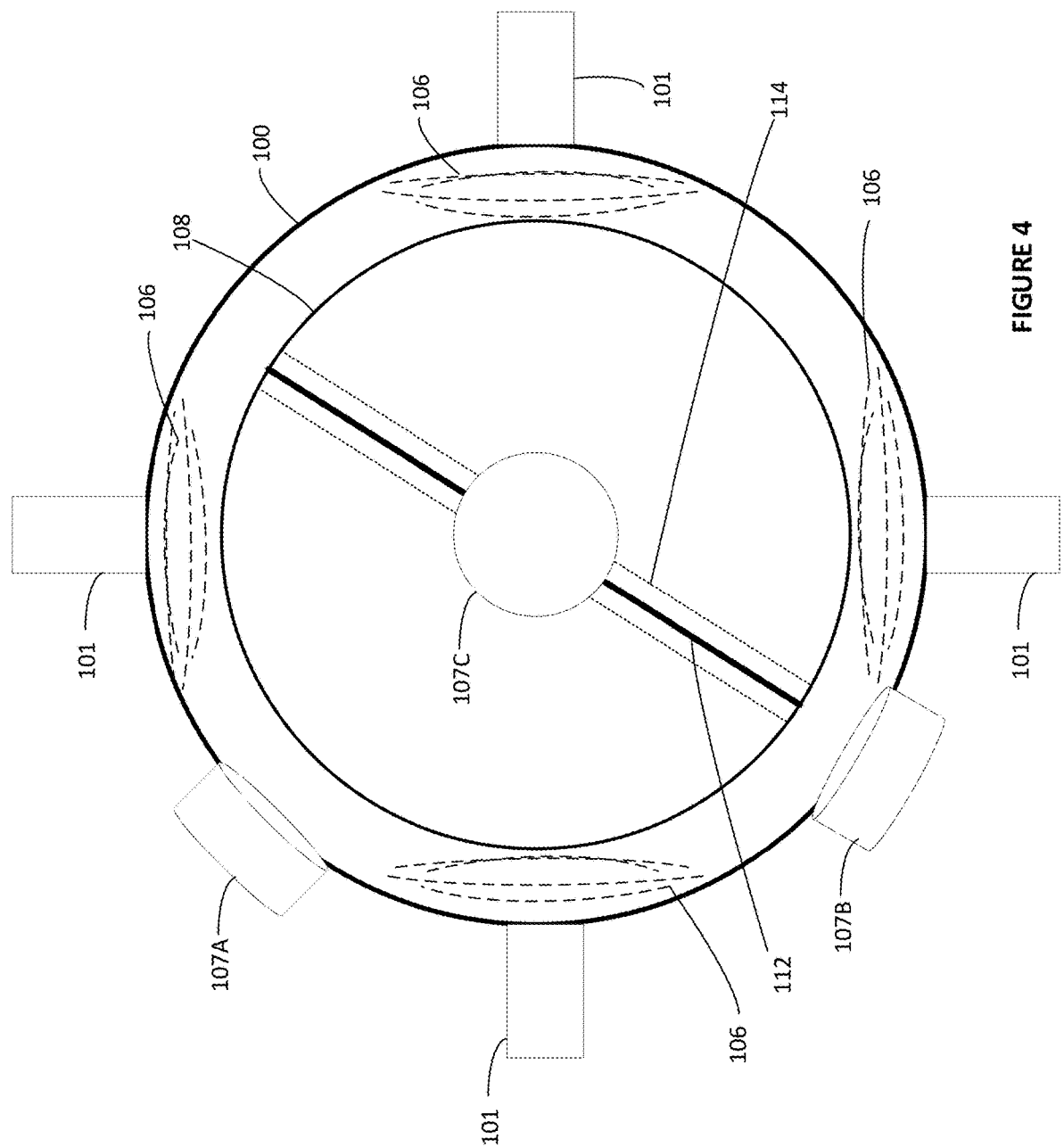
FIG. 4 illustrates an example of an embodiment using high resolution cameras.

FIG. 4 illustrates an example of an embodiment of a second approach using high resolution cameras. The second approach for measurement is the use of one or more high resolution cameras 107, which could be positioned axially to view the rotated body and thus read out directly the rotation of the body in each of three axis. This would be facilitated by strategic markings of the body that the camera can image and then a controller can interpret the rotation of the body based on the markings. For example, FIG. 4 illustrates cameras 107A, 107B, and 107C positioned such that they view the element 108 at orthogonal angles. As illustrated in FIG. 4, camera 107C is positioned on the housing 100 and pointed into the housing 100 (e.g., into the page relative to the orientation of FIG. 4).

The markings on the element 108 are patterned using size, shape, position and color such that an unambiguous, and accurate rotation angle about each axis can be determined by appropriate processing of all of the camera's images.

FIG. 4 also illustrates an embodiment where the element 108 includes an aperture 114 through the center of the element 108. For example, the aperture 114 is through an axis or a diameter) of the element 108. Magnetic material 112 has been inserted in the aperture 114 to provide element 108 with a magnetic property.

In addition the basic functionality of the device as described above, there are at least three additional embodiments described here. With respect to the device as a magnetometer, it should be noted that the device as described above is capable of measuring the magnetic field's direction only. This is sufficient for many measuring applications, but it may be advantageous to be able to measure the field strength as well as its direction. In order to accomplish this with the device as described above, it would only be necessary to add a series of electromagnetic coils, arranged on the axes of the device itself. By then alternating between a raw measurement of the three dimensional rotation of the body (without coil activation) and then sequential measurements of the rotation of the body with one or more coils energized with a known level of field generation, it is possible to calculate the strength of the local field from the rotation differences cause by the external coils influence.

Figure 5:
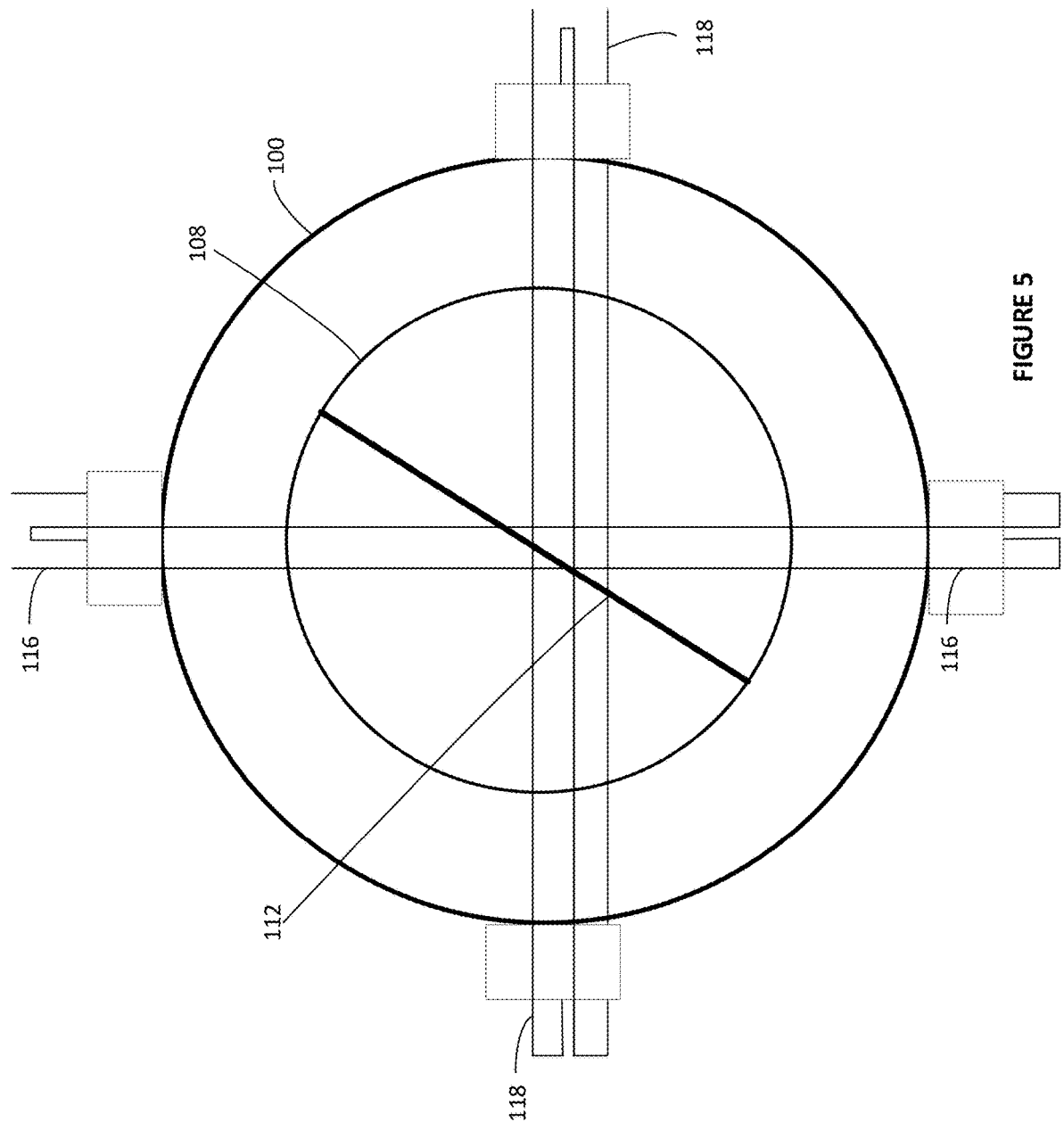
FIG. 5 illustrates an example of an embodiment that that uses external coils to cancel out existing magnetic fields.

FIG. 5 illustrates an example of an embodiment that that uses external coils 116, 118 to cancel out existing magnetic fields, for example, to effectively null out the earth's local magnetic field, and thus become more sensitive to small changes caused by field disturbances which are the subject of the desired measurement. As illustrated in FIG. 5, the first set of coils 116 is positioned vertically (relative to the orientation of FIG. 5) and a second set of coils 118 is positioned horizontally (relative to the orientation of FIG. 5), such that the second set of coils 118 is aligned perpendicular to the first set of coils 116. In other embodiments, more than two sets of coils may be used.

Finally, by the use of two or more of these devices in reasonably close proximity, it is possible to form a magnetic field gradiometer, which has the effect of minimizing the undesired rotations of the body vessel or vehicle or aircraft carrying the magnetometer(s) for measurement purposes.

FIG. 6 is a picture illustrating an example of an embodiment of a 3D sensing element suspension measurement system where the housing includes an upper portion having a plurality of ultrasonic transmitters and a lower portion having a plurality of ultrasonic transmitters.

FIG. 7 is another picture of the embodiment of a 3D sensing element suspension measurement system illustrated in FIG. 6.

The foregoing description details certain embodiments of the systems, devices, and methods disclosed herein. It will be appreciated, however, that no matter how detailed the foregoing appears in text, the systems, devices, and methods can be practiced in many ways. As is also stated above, it should be noted that the use of particular terminology when describing certain features or aspects of the invention should not be taken to imply that the terminology is being redefined herein to be restricted to including any specific characteristics of the features or aspects of the technology with which that terminology is associated.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Headings are included herein for reference and to aid in locating various sections. These headings are not intended to limit the scope of the concepts described with respect thereto. Such concepts may have applicability throughout the entire specification.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

The phrase "based on" does not mean "based only on," unless expressly specified otherwise. In other words, the phrase "based on" describes both "based only on" and "based at least on." Unless otherwise explicitly stated, articles such as "a" or "an" should generally be interpreted to include one or more described items. Accordingly, phrases such as "a device configured to" are intended to include one or more recited devices.

It will be appreciated by those skilled in the art that various modifications and changes may be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the figures may be combined, interchanged or excluded from other embodiments.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims. Applicant reserves the right to submit claims directed to combinations and sub-combinations of the disclosed inventions that are believed to be novel and non-obvious. Inventions embodied in other combinations and sub-combinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

What is claimed is:

1. A system for determining movement, comprising:
a sensor comprising:
a housing having a space within the housing;
an object having a magnetic property along an axis of the object forming a magnetic orientation of the object, the object positioned within the space in the housing;
a plurality of ultrasound transmitters arranged around the space such that the object is in-between at least a portion of the plurality of ultrasound transmitters, the plurality of ultrasound transmitters configured to collectively generate ultrasonic sound waves that strike the object, the ultrasonic sound waves causing the object to be suspended in the space between the plurality of ultrasound transmitters, with the axis aligned in a position relative to a magnetic field; and
one or more detectors configured to produce signals corresponding to the movement of the object in the space.

2. The system of claim 1, further comprising a controller that receives the movement signals from the one or more detectors and determines movement information of the sensor in at least one dimension.

3. The system of claim 2, wherein the system operates as a magnetometer.

4. The system of claim 2, wherein the controller receives the movement signals and determine movement information of the sensor in two or more dimensions.

5. The system of claim 1, wherein the object comprises a spherical body.

6. The system of claim 1, wherein the object comprises an aperture on the axis, and the object further comprising magnetic material positioned in the aperture.

7. The system of claim 1, wherein the one or more detectors detection mechanism comprise at least one camera.

8. The system of claim 7, wherein the object comprises one or more alignment marks, and the at least one camera is configured to image the one or more alignment marks.

9. The system of claim 1, wherein the one or more detectors comprise at least one laser tracking system comprising at least one laser light transmitter and one laser light receiver.

10. The system of claim 1, wherein the plurality of ultrasound transmitters comprises four or more ultrasound transmitters.

11. The system of claim 1, wherein the plurality of ultrasound transmitters are arranged to produce ultrasound waves aligned in at least three different directions.

12. The system of claim 1, further comprising a fluid in the space within the housing, the object being suspended in the fluid.

13. The system of claim 12, wherein the fluid is a gas.

14. The system of claim 12, wherein the fluid is a liquid.

15. The system of claim 1, further comprising one or more excitation coils configured to cancel the effect of an existing magnetic field on the object.

16. A method, comprising:
providing a sensor comprising:
a housing having a space within the housing,
a plurality of ultrasound transmitters arranged around the space such that an object positioned in the space is in-between at least a portion of the plurality of ultrasound transmitters, and
one or more detectors;
positioning the object in the space in-between at least a portion of the plurality of ultrasound transmitters, wherein the object is magnetized along an axis, and the axis is aligned relative to a magnetic field when the object is positioned in the space;
providing acoustic energy from the plurality of ultrasound transmitters incident on the object, the acoustic energy suspending the object in-between at least a portion of the plurality of ultrasound transmitters;
generating signals from the one or more detectors based on movement of the object; and
determining, by a controller, movement of the sensor in at least one dimension based on the signals received from the one or more detectors.

17. The method of claim 16, wherein the housing comprises a liquid in the space within the housing, the object being suspended in the liquid.

18. A system for determining movement, comprising:
a sensor comprising:
a housing having a fluid in a space within the housing,
an object positioned within the space in the fluid, the object being magnetized along an axis,
a plurality of ultrasound transmitters arranged around the space such that the object is in-between at least a portion of the plurality of ultrasound transmitters, the plurality of ultrasound transmitters configured to collectively generate ultrasonic sound waves that strike the object, the plurality of ultrasound transmitters arranged to produce ultrasonic sound waves aligned in at least three different directions;
one or more detectors positioned to generate signals based on the movement of the object within the space;
a controller that receives the movement signals from the one or more detectors and determines movement information of the sensor in at least one dimension.

19. The system of claim 18, wherein the fluid is a liquid.

20. The system of claim 18, wherein the plurality of ultrasound transmitters comprises at least four ultrasound transmitters.

* * * * *

UNITED STATES PATENT AND TRADEMARK OFFICE
CERTIFICATE OF CORRECTION

PATENT NO. : 11,041,878 B2
APPLICATION NO. : 16/737203
DATED : June 22, 2021
INVENTOR(S) : Christopher Todter Page 1 of 1

It is certified that error appears in the above-identified patent and that said Letters Patent is hereby corrected as shown below:

In the Claims

In Column 13, Line 2, Claim 7, delete "detection mechanism comprise" and insert --comprise--.

Signed and Sealed this
Thirty-first Day of August, 2021

Drew Hirshfeld
*Performing the Functions and Duties of the
Under Secretary of Commerce for Intellectual Property and
Director of the United States Patent and Trademark Office*